US010832965B2

(12) United States Patent
Xu et al.

(10) Patent No.: US 10,832,965 B2
(45) Date of Patent: Nov. 10, 2020

(54) FIN REVEAL FORMING STI REGIONS HAVING CONVEX SHAPE BETWEEN FINS

(71) Applicant: GLOBALFOUNDRIES INC., Grand Cayman (KY)

(72) Inventors: Yiheng Xu, Clifton Park, NY (US); Haiting Wang, Clifton Park, NY (US); Qun Gao, Clifton Park, NY (US); Scott Beasor, Greenwich, NY (US); Kyung Bum Koo, Albany, NY (US); Ankur Arya, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/868,229

(22) Filed: Jan. 11, 2018

(65) Prior Publication Data
US 2019/0214308 A1    Jul. 11, 2019

(51) Int. Cl.
| H01L 21/8234 | (2006.01) |
| H01L 27/088 | (2006.01) |
| H01L 29/06 | (2006.01) |
| H01L 29/161 | (2006.01) |
| H01L 21/762 | (2006.01) |
| H01L 21/311 | (2006.01) |
| H01L 21/3105 | (2006.01) |

(52) U.S. Cl.
CPC ........ *H01L 21/823481* (2013.01); *H01L 21/31055* (2013.01); *H01L 21/31116* (2013.01); *H01L 21/76224* (2013.01); *H01L 21/76229* (2013.01); *H01L 21/76232* (2013.01); *H01L 21/823431* (2013.01); *H01L 27/0886* (2013.01); *H01L 29/0649* (2013.01); *H01L 29/161* (2013.01)

(58) Field of Classification Search
None
See application file for complete search history.

(56) References Cited

U.S. PATENT DOCUMENTS

| 7,482,245 | B1 | 1/2009 | Yu et al. | |
| 8,946,829 | B2 | 2/2015 | Wann et al. | |
| 9,171,935 | B2 | 10/2015 | Kim et al. | |
| 9,666,474 | B2 | 5/2017 | Briggs et al. | |
| 9,812,358 | B1 * | 11/2017 | Huang | H01L 21/76897 |
| 2011/0097889 | A1 * | 4/2011 | Yuan | H01L 21/76224 438/595 |
| 2014/0225219 | A1 * | 8/2014 | Huang | H01L 29/66795 257/510 |

(Continued)

*Primary Examiner* — John A Bodnar
(74) *Attorney, Agent, or Firm* — Gibb & Riley, LLC

(57) ABSTRACT

Integrated circuit devices include trenches in a material layer that divide the material layer into fins. With such devices, an insulator partially fills the trenches and contacts the material layer. The top surface of the insulator (e.g., the surface opposite where the insulator contacts the material layer) has a convex dome shape between at least two of the fins. The dome shape has a first thickness from (from the bottom of the trench) where the insulator contacts the fins, and a second thickness that is greater than the first thickness where the insulator is between the fins. Further, there is a maximum thickness difference between the first and second thicknesses at the midpoint between the fins (e.g., the highest point of the dome shape is at the midpoint between the fins). Also, the top surface of the first insulator has concave divots where the first insulator contacts the fins.

14 Claims, 6 Drawing Sheets

(56) References Cited

U.S. PATENT DOCUMENTS

2016/0315146 A1* 10/2016 Jung .................... H01L 29/0847
2016/0365453 A1* 12/2016 Kim .................... H01L 29/7856
2017/0256645 A1* 9/2017 Chung ............ H01L 21/823807

* cited by examiner

US 10,832,965 B2

FIN REVEAL FORMING STI REGIONS HAVING CONVEX SHAPE BETWEEN FINS

BACKGROUND

Field of the Invention

The present disclosure relates to integrated circuit structures and the manufacture thereof, and more specifically to fin reveal processing that forms shallow trench isolation (STI) regions having a convex dome shape between fins.

Description of Related Art

Integrated circuit devices use transistors for many different functions, and these transistors can take many different forms, from planar transistors, to vertical transistors, to transistors that use a "fin" style structure. Generally, transistor structures are formed by depositing or implanting impurities into a material layer or fin to form at least one semiconductor channel region, bordered by shallow trench isolation regions below the top (upper) surface of the material layer. A "material layer" can be any material appropriate for the given purpose (whether now known or developed in the future) and can be, for example, silicon-based wafers (bulk materials), ceramic materials, organic materials, oxide materials, nitride materials, etc., whether doped or undoped.

The "shallow trench isolation" (STI) regions of such structures are generally formed by patterning openings/trenches and growing or filling the openings with a highly insulating material, and this allows different active areas to be electrically isolated from one another. With fin-type structures, after the STI insulator is deposited over the fins, a "fin reveal" process is performed that reduces the thickness of the insulator so that the top portion of the fins is exposed or revealed.

However, during the fin reveal process, the top surface of the STI insulator between fins that are spaced far apart from one another can dip between adjacent fins, causing the upper surface of the insulator to have a concave shape. In addition, the areas where the insulator contacts the fins can partially climb the fin and create an oxide footing on the fin. Unfortunately, the concave shape of the insulator reduces isolation between adjacent fins. Further, the oxide footing can interfere with the threshold voltage and other transistor parameters, making the performance of the device inconsistent.

SUMMARY

Integrated circuit devices herein include, among other components, a material layer (e.g., doped silicon), and trenches in the material layer that divide the material layer into fins. Transistors can optionally be included in/on the fins. With such structures a first insulator partially fills the trenches and contacts the material layer. The top surface of the insulator (e.g., the surface opposite the bottom of the trench where the insulator contacts the material layer) has a convex dome shape between at least two of the fins. Also, a second insulator (such as an inter-layer dielectric (ILD)) can be included on the first insulator, the fins, the transistors, etc. In greater detail, the first insulator includes shallow trench isolation (STI) regions between the fins; and can be, for example, a flowable oxide.

The convex dome shape of the top surface of the first insulator has a first thickness from the bottom of the trench where the first insulator contacts the fins, and a second thickness from the bottom of the trench (that is greater than the first thickness) where the first insulator is between the fins. Further, there is a maximum thickness difference (between the first thickness and the second thickness) at the midpoint between the fins (e.g., the highest point of the dome shape is at the midpoint between the fins).

Note that the dome shape is formed at the top surface of the insulator between fins that are spaced a first distance from each other, but the dome shape is smaller (or not formed) at the top surface of the insulator between fins that are spaced closer to each other than the first distance. Also, the top surface of the first insulator has divots where the first insulator contacts the fins.

Various methods herein form trenches in a material layer to pattern the material layer into fins. These methods also deposit an insulator in the trenches, and remove portions of the insulator, first in a chemical-mechanical polishing (CMP) process, and then in an etching process that uses a gas (e.g., HF). The later etching process reveals portions of the fins, and the flow of the gas in the etching process is controlled to form the insulator into the dome shape between at least two of the fins. More specifically, the flow of the gas is controlled to cause more etching where the insulator contacts the fins, relative to areas of the insulator that are positioned between the fins. Also, the etching process performed on the insulator forms divots in the insulator where the insulator contacts the fins.

BRIEF DESCRIPTION OF THE DRAWINGS

The embodiments herein will be better understood from the following detailed description with reference to the drawings, which are not necessarily drawn to scale and in which.

DETAILED DESCRIPTION

As noted above, during the fin reveal process, the top surface of the STI insulator between fins that are spaced far apart from one another can dip between adjacent fins, causing the upper surface of the insulator to have a concave shape, and an oxide footing along the fin. The concave shape of the insulator reduces isolation between adjacent fins, and the oxide footing can make the performance of the device inconsistent. In view of this, with methods and structures herein, the top surface of the STI insulator has a convex dome shape, and the top surface of the insulator has concave divots where the first insulator contacts the fins.

Figure 1:
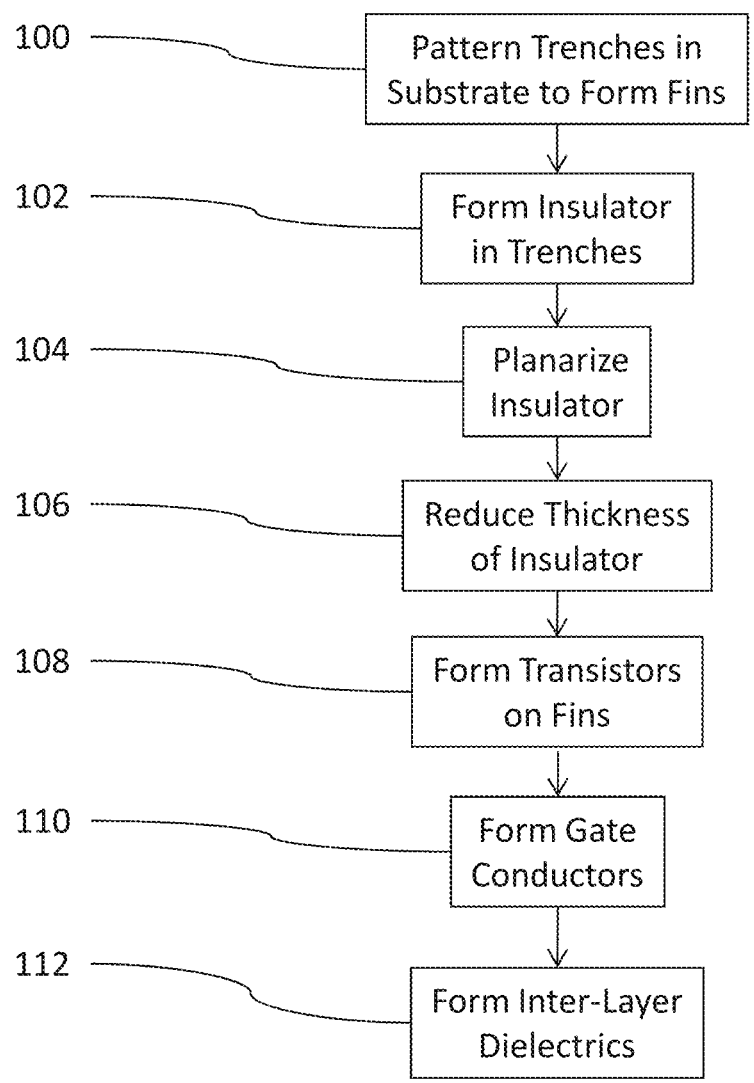
FIG. 1 is a flow diagram illustrating embodiments herein.

In greater detail, as shown in flowchart form in FIG. 1, methods herein form trenches in a material layer to pattern the material layer into fins in item 100. These methods also form an insulator in the trenches, in item 102 by, for example, depositing a flowable oxide. Flowable oxides are often used for shallow trench isolation and interlayer dielectric (ILD) isolation structures. Flowable oxides are commonly formed in flowable chemical vapor deposition (FCVD) processing. This involves an initial conversion of the flowable insulator form in the FCVD processing to $SiO_2$ in an oxidizing ambient such as steam, followed by a high temperature densification anneal.

The insulator is planarized, in item 104, in a chemical-mechanical polishing (CMP) process. Common CMP processes use abrasives and corrosive chemicals in conjunction with a polishing pad, which is rotated with different axes of rotation (i.e., not concentric). This removes material and tends to even out any irregular topography, making the wafer flat or planar.

Following this, in item 106, the thickness of the insulator is reduced to reveal the upper portion of the fins. For example, item 106 can use an etching process that uses a gas. This etching process controls the flow of the gas to form the insulator into the dome shape between at least two of the fins. More specifically, hydrogen fluoride (HF) and ammonia ($NH_3$) are exemplary process gases for the fin reveal process performed in item 106, and such are flowed below 5 sccm at 20° C.-25° C. during conventional fin reveal etching processes. However, in item 106, the gas flow rates are increased. For example, in item 106, HF can be flowed between 40-200 sccm, $NH_3$ can be flowed between 40-200 sccm, etc., and such flows can be performed between temperatures of 60° C.-150° C.

This increased flow rate and increased temperature of the etchant gas causes more rapid removal of the insulator closer to the fins, and less rapid removal of the insulator further from the fins, resulting in the convex dome shape of the top of the insulator between the fins, and the concave divots where the insulator contacts the fins. Generally, when the gas flow rates increase during etching, there are more inactive species in the chamber. Such inactive species increase etching rates, and are more likely to stick to a silicon surface (e.g., the fin surface), and not the insulator (oxide surface), causing relatively more insulator material removal to occur closer to the fins, and relatively less insulator material removal to occur in locations between the fins. In other words, there is more etching at the fin/insulator (Si/oxide) boundary because of the increased amount of inactive species located at the fin/insulator boundary. This also causes the dome to be more pronounced between fins that are further apart, relative to those that are closer together.

The dome shape of the insulator formed in item 106 has a first thickness from the bottom of the trench (from the material layer) where the insulator contacts the fins, and a second thickness that is greater than the first thickness where the insulator is between the fins. Thus, there is a maximum thickness difference (between the first thickness and the second thickness) at a midpoint between the fins. Note that the dome shape is formed in item 106 at the top surface of the insulator between fins that are spaced a first distance from each other, but the dome shape is reduced or not formed at the top surface of the insulator between fins that are spaced closer to each other than the first distance. Also, the etching process performed on the insulator in item 106 forms divots in the insulator where the top surface of insulator contacts the fins. Here, the "top" surface of the insulator is that surface which is distal to (opposite) the bottom of the trenches, and the "bottom" of the trenches is the surface of the material layer that is between, and perpendicular to, the sidewalls of the fin.

With the fins revealed, functional and dummy transistors are formed in item 108, gate conductors are formed in item 110, and inter-layer dielectrics are formed in item 112, as discussed more below.

Figure 2:
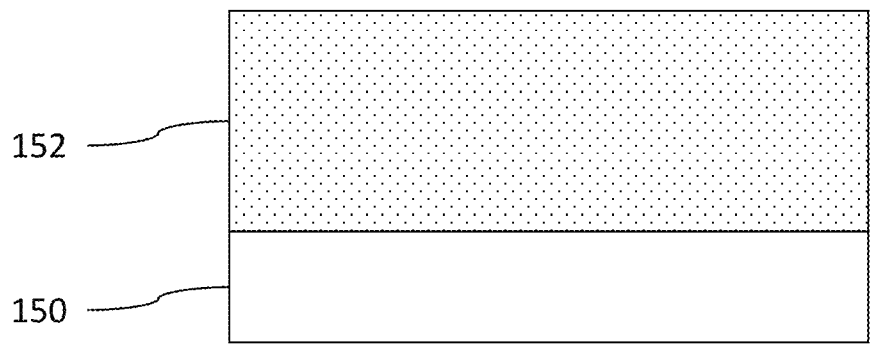
FIGS. 2-6 are cross-sectional schematic diagrams of integrated circuit structures produced according to embodiments herein.
Figure 3:
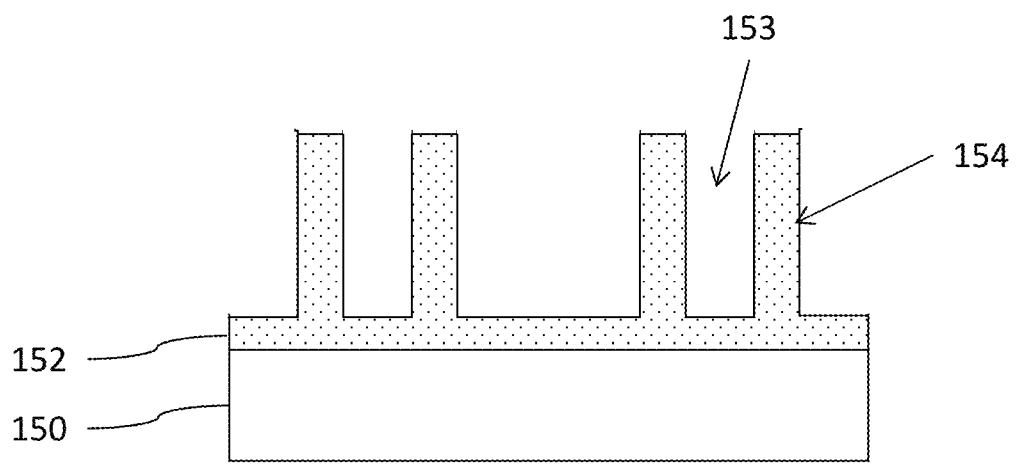
Figure 4:
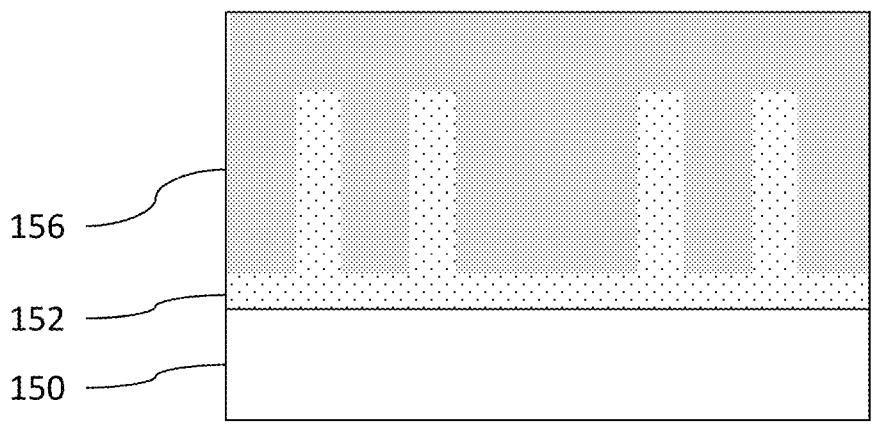
Figure 5:
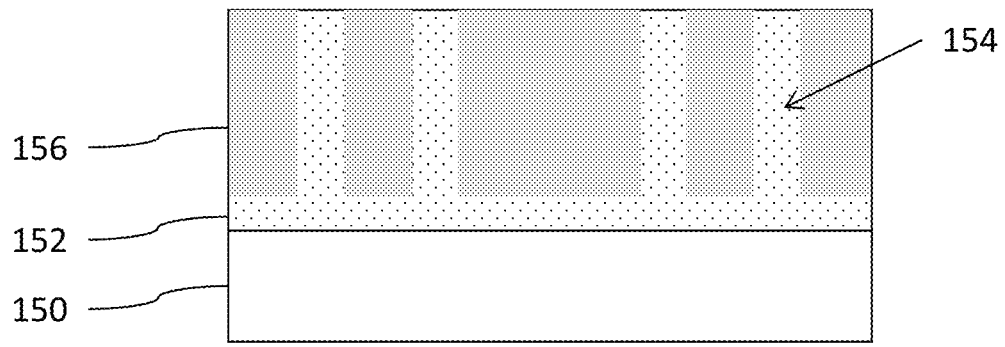

This is also shown in FIGS. 2-6, which are cross-sectional views of an exemplary integrated circuit structure. In FIG. 2, a silicon material layer 152 (e.g., SiGe) is formed on a substrate 150 (such as a silicon on insulator (SOI) material layer). In FIG. 3, the silicon layer 152 is patterned into fins 154. Therefore, FIGS. 2 and 3 illustrate channel regions 152 that are formed as fins 154 (e.g., SiGe channels can be created in fins for fin-type field effect transistors (FinFETs); and alternatively, SiGe channels can be patterned in material layers. Between the fins, shallow trenches 153 are formed or exposed, and these will be later filled with insulators to create shallow trench isolation structures. As shown in FIG. 4, a flowable insulator 156 is formed (e.g., an insulator is flowed in a FCVD process). FIG. 5 illustrates the planarized structure after CMP processing.

Figure 6:
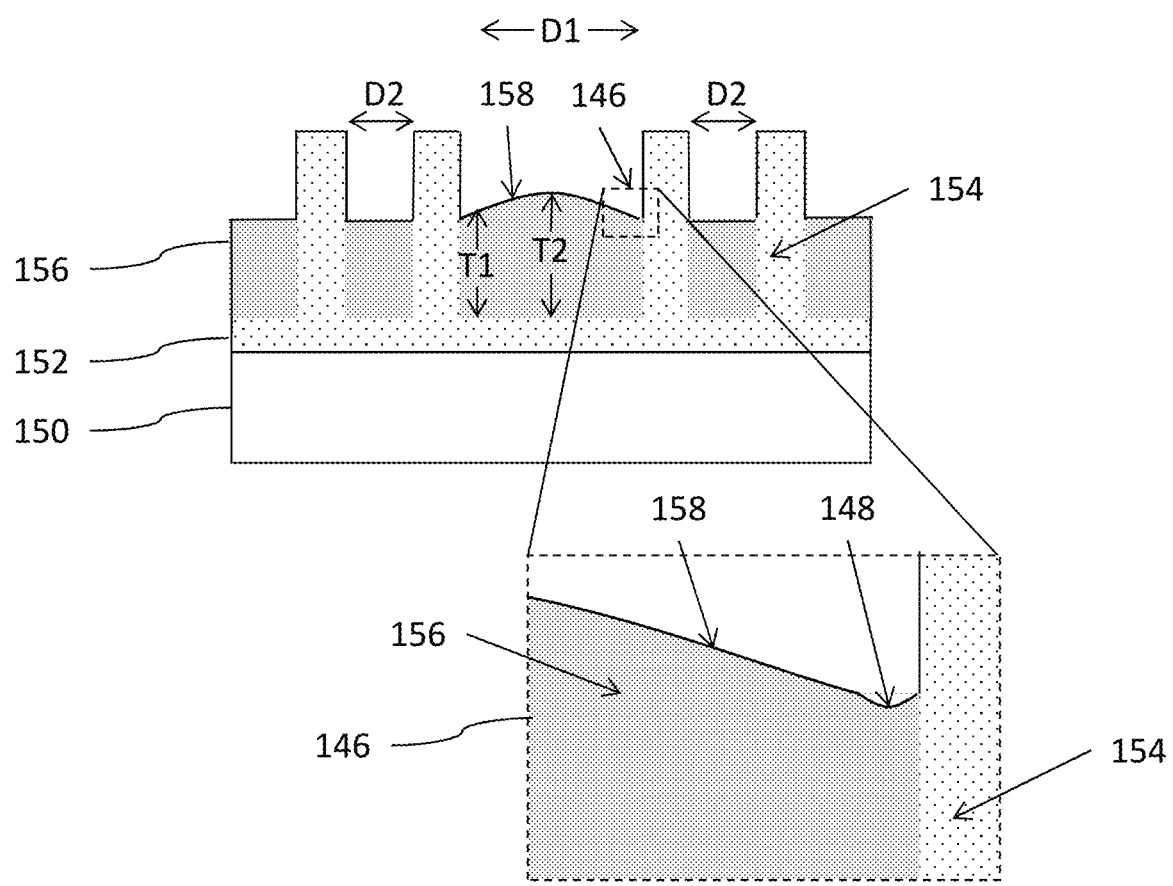

FIG. 6 illustrates the structure after the controlled gas flow etch processing, which forms the dome 158 between fins 154. More specifically, FIG. 6 shows that the convex dome shape 158 of the top surface of the first insulator 156 has a first thickness T1 from the bottom of the trench 153 (e.g., from the material layer 152) where the first insulator 156 is adjacent to, and contacts, the fins 154; and the convex dome shape 158 of the top surface of the first insulator 156 has a second thickness T2 from the bottom of the trench 153 (e.g., from the material layer 152) that is greater than the first thickness T1, where the top surface of the first insulator 156 is the surface of the material layer 152 between the fins 154 that is perpendicular to the sidewalls of the fins 154. Further, there is a maximum thickness difference (between the first thickness and the second thickness) at the midpoint (where T2 is measured) between the fins 154 (e.g., the highest point of the dome shape 158 is at the midpoint between the fins 154 where T2 is measured). Therefore, the dome shape 158 of the top surface of the insulator 156 forms a convex.

As mentioned above, when the gas flow rates increase during etching, there are more inactive species in the etching chamber. Such inactive species (which increase the etching rate) are more likely to stick to the silicon surfaces (e.g., the fin surface 154) causing relatively more insulator material 156 removal to occur closer to the fins 154, and relatively less insulator material 156 removal to occur in locations between the fins 154 (etching more at the Si/oxide boundary). This also causes the dome 158 to be more pronounced between fins 154 that are further apart, and this can be seen in FIG. 6 where the dome shape 158 is formed at the top surface of the insulator 156 between fins 154 that are spaced a first distance D1 from each other, but the dome shape 158 is not formed at the top surface of the insulator 156 between fins 154 that are spaced distance D2, which is closer to each other than the first distance D1.

Also, the top surface of the first insulator 156 has concave divots 148 where the first insulator 156 contacts the fins 154 as a result of the higher concentration of inactive species that accumulate directly adjacent to the fins 154 during etching. The divots 148 are shown in an expanded portion 146 of the illustration in FIG. 6. As can be seen in the expanded portion 146, the top surface of the insulator 156 includes a concave divot 148 where the surface of the insulator 156 contacts the fin 154. In other words, the concave shape of the divot 148 has the opposite (inverted) curvature relative to the convex shape of the dome 158, and the curved portion of the divot 148 is much smaller than (e.g., less than 20%, 10%, 5%, etc. the size (surface length) of) the curved portion of the dome 158.

Figure 7A:
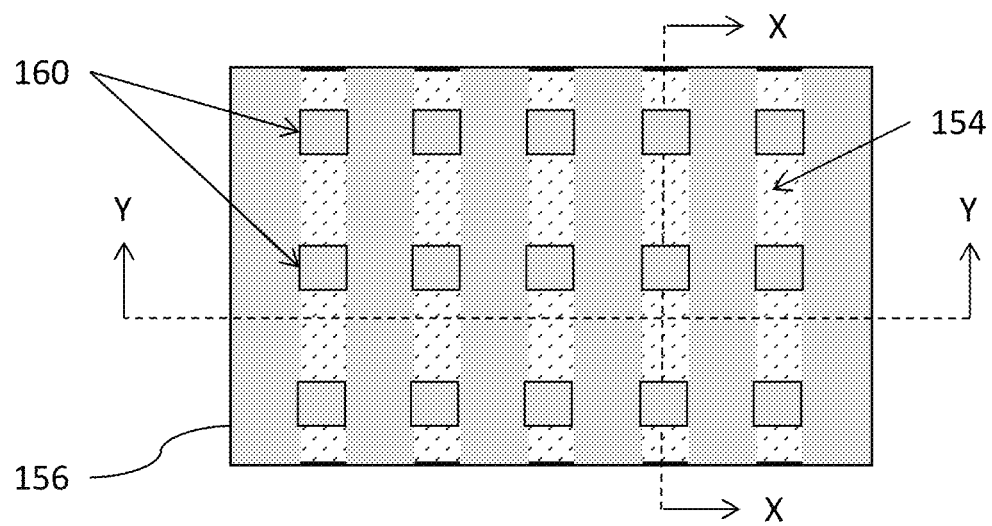
FIG. 7A is a top-view schematic diagram of integrated circuit structures produced according to embodiments herein.
Figure 7B:
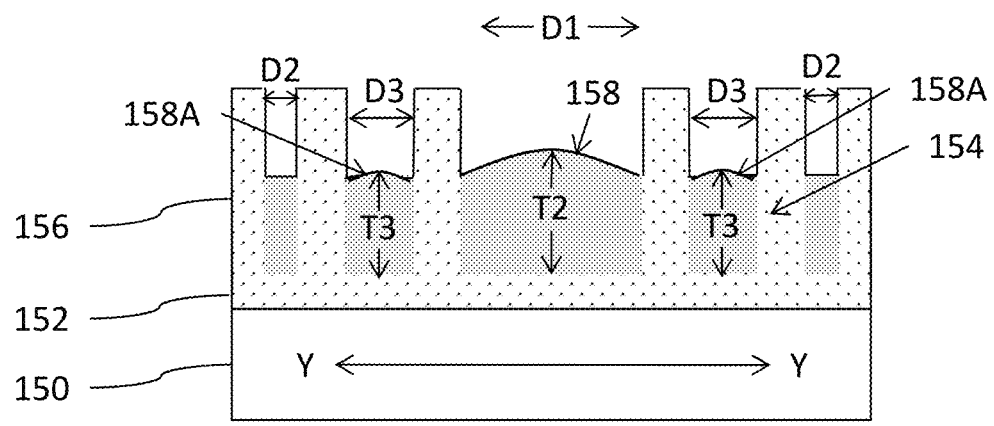
FIGS. 7B-7C are cross-sectional schematic diagrams of the integrated circuit structure shown in FIG. 7A.
Figure 7C:
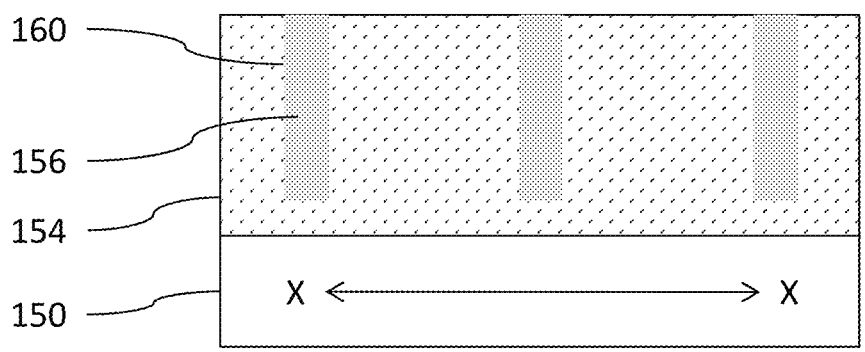

FIG. 7A is a top-view schematic diagram of an integrated circuit structure, FIG. 7B is a cross-sectional schematic diagram of the integrated circuit structure shown in FIG. 7A along line Y-Y (and is the same view shown in FIGS. 2-6, discussed above), and FIG. 7C is a cross-sectional schematic diagram of the integrated circuit structure shown in FIG. 7A along line X-X. FIGS. 7A and 7B illustrates the multiple parallel semiconductor fins 154 within the insulator layer 156, while FIG. 7C illustrates a profile of only one of the fins 154. Additionally, FIGS. 7A and 7C illustrates that each of the fins 154 includes isolation regions 160 in which the insulator layer 156 has been formed.

FIG. 7B illustrates processing after the above-mentioned fin reveal has been performed. More specifically, various processing is performed to remove a portion of the insulator layer 156 between the fins 154, but this processing leaves the insulator layer 156 in the isolation regions 160.

While FIG. 6 illustrates an extreme example having no dome shape (flat, planar surface) between closely spaced fins, and a convex dome shape 158 between less closely spaced fins, FIG. 7B illustrates alternative structures created by more closely spaced fins and less closely spaced fins. As shown in FIG. 7B, the relatively more closely spaced fins, in combination with the gas flow rates increase, produces an upper surface of the shallow trench insulator 156 with a convex dome shape 158A, that is somewhat less thick (T3) from the bottom of the trench 153, relative to the thickness T1 of the convex dome shape 158 of the upper surface of the shallow trench insulator 156 between fins that are relatively less closely spaced. Therefore, the dome shape 158 is formed at the top surface of the insulator between fins that are spaced a first distance D1 from each other, but the dome shape 158A is smaller at the top surface of the insulator between fins that are spaced a second distance D3 (closer to each other than the first distance D1).

Figure 8A:
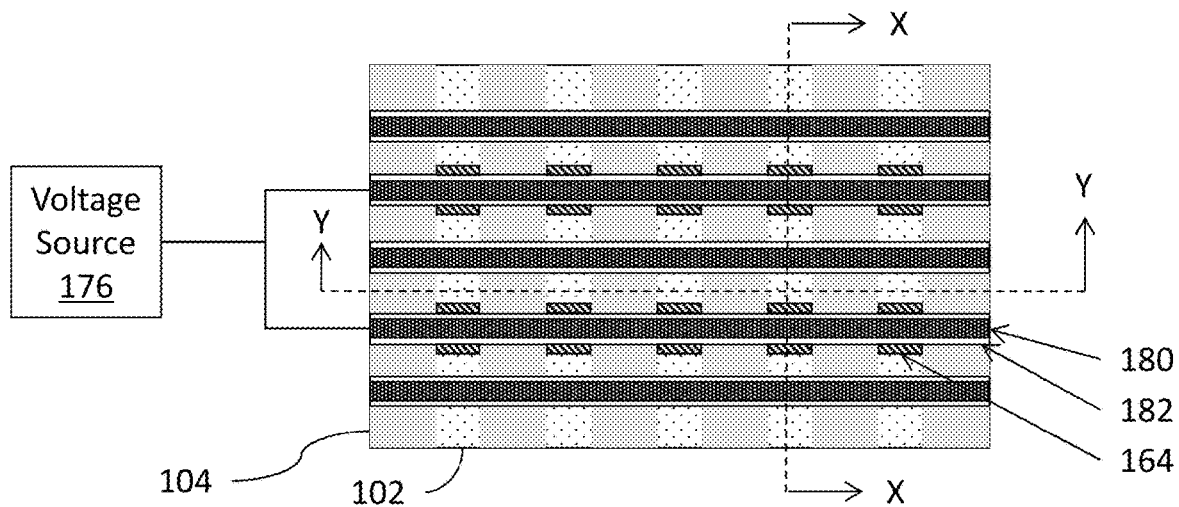
FIG. 8A is a top-view schematic diagram of integrated circuit structures produced according to embodiments herein.
Figure 8B:
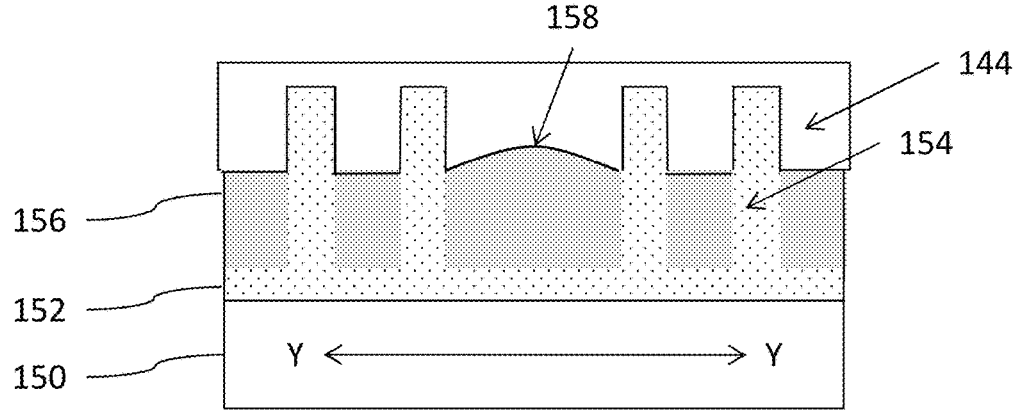
FIGS. 8B-8C are cross-sectional schematic diagrams of the integrated circuit structure shown in FIG. 8A.

Similarly to FIGS. 7A-7C, FIG. 8A is a top-view schematic diagram, FIG. 8B is a cross-sectional schematic diagram of the integrated circuit structure shown in FIG. 8A along line Y-Y (and is the same view shown in FIGS. 2-7B, discussed above), and FIG. 8C is a cross-sectional schematic diagram of the integrated circuit structure shown in FIG. 8A along line X-X.

Figure 8C:
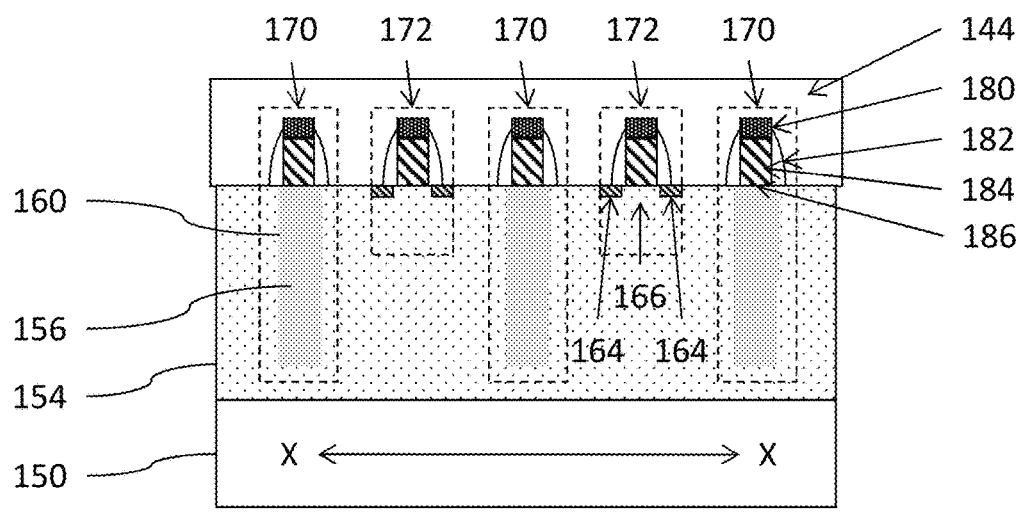

As shown in FIG. 8C, methods herein form gate stacks 180-186 contacting, and spaced along the top of each fin 154, and an inter-layer dielectric (ILD) 144 (second insulator) over the whole structure (and in the tops of the trenches between the fins on the first insulator 156). Each of the gate stacks includes a hardmask cap (e.g., nitride) 180, connected to which is a gate conductor (metal, polysilicon, etc.) 184, and connected to that is a gate insulator (e.g., oxide) 186; and spacers 182 (e.g., nitride, oxide, etc.) on the sidewalls of the foregoing elements. Any conventional gate stack formation processing can be use, whether currently known, or developed in the future to form the gate stacks 180-186. Additional processing forms source and drain regions 164 in the fins 154 (potentially using the gate stack as a self-alignment aid).

The source and drain 164 regions, and the semiconductor portion of the fin 166 (channel region) that contacts some of such gate stacks 180-186, form functional transistors 172. In contrast, other gate stacks 180-186, and the insulator 156 in the isolation regions 160, form non-functional diffusion breaks 170 on opposite sides of the functional transistors 172. The non-functional transistors 170 are diffusion breaks that insulate functional transistors 172 from one another.

As shown in FIG. 8A, the conductive gate 180 of the functional transistors 172 are connectable to a voltage source 176; however, the conductive gates 184 of the non-functional diffusion breaks 170 are insulated from voltage source 176. These non-functional diffusion breaks 170 insulate the functional transistor 172 from other structures.

Figure 9:
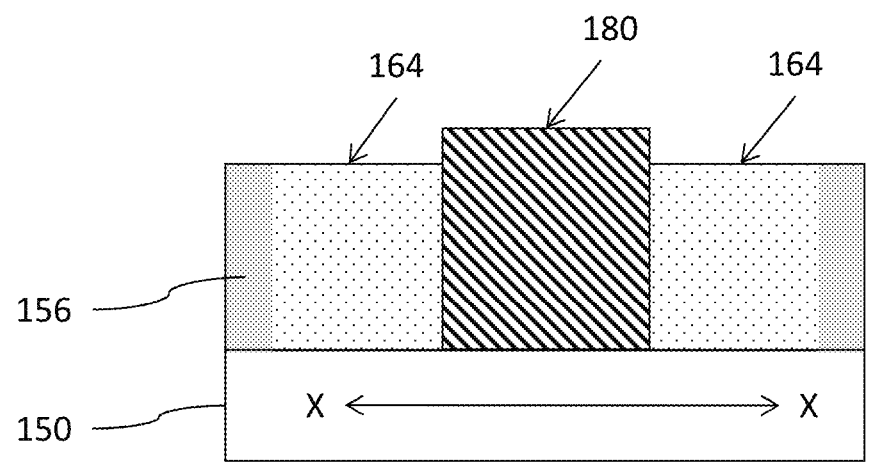
FIG. 9 is a cross-sectional schematic diagram of integrated circuit structures produced according to embodiments herein.

FIG. 9 illustrates another type of fin-type transistor (FinFET) that includes full fin thickness doped source/drain regions 164 separating a full fin thickness channel region that is covered by a gate oxide and gate conductor 180, with isolation regions of the insulator 156 discussed above.

Such methods produce various integrated circuit structures as shown, for example, in FIGS. 6-9 that include (among other components) a substrate 150/152, and trenches 153 in the substrate 150/152 that divide the substrate 150/152 into fins 154. Transistors 170, 172 can optionally be included on the fins 154. With such structures a first insulator 156 partially fills the trenches and contacts the substrate 150/152. The top surface of the insulator (e.g., the surface opposite where the insulator contacts the substrate 150/152) has a dome shape 158 between at least two of the fins 154. Also, a second insulator 144 (such as an inter-layer dielectric (ILD)) can be included on the first insulator 156 in the trenches, the fins 154, the transistors 170, 172, etc.

The dome shape 158 of the first insulator 156 has a first thickness T1 from the substrate 150/152 where the first insulator 156 contacts the fins 154, and a second thickness T2 from the substrate 150/152 that is greater than the first thickness T1 where the first insulator 156 is between the fins 154. Further, there is a maximum thickness difference between the first thickness and the second thickness at the midpoint between the fins 154 (e.g., the highest point of the dome shape 158 is at the midpoint between the fins 154 where T2 is measured). Note that the dome shape 158 is formed at the top surface of the insulator 156 between fins 154 that are spaced a first distance D1 from each other, but the dome shape 158 is smaller, or not formed, at the top surface of the insulator between fins 154 that are spaced closer to each other (D2 or D3) than the first distance D1. Also, the top surface of the first insulator 156 has divots 148 where the first insulator 156 contacts the fins 154. Thus, the first insulator 156 includes a shallow trench isolation (STI) region between the fins 154; and can be, for example, a flowable oxide. The substrate 150/152 commonly includes a semiconductor, such as SiGe.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Within transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions, or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit device comprising:
   a material layer;
   trenches in the material layer dividing the material layer into fins; and
   an insulator partially filling the trenches and contacting the material layer, wherein a top surface of the insulator has a first convex shape between first adjacent fins of the fins and a second convex shape between second adjacent fins of the fins, wherein the highest point of curvature of the first convex shape and the second convex shape occurs at a midpoint between the fins, wherein the midpoint of the first convex shape of the top surface of the insulator is a first thickness from a bottom of the trenches between the first adjacent fins that are spaced a first distance from each other, and the midpoint of the second convex shape of the top surface of the insulator is a second thickness from the bottom of the trenches between the second adjacent fins that are spaced a second distance from each other, wherein the first thickness is greater than the second thickness and the first distance is greater than the second distance, wherein third adjacent fins of the fins are spaced a third distance that is less than the first distance and the second distance, and wherein the top surface of the insulator between the third adjacent fins has a flat, planar shape.

2. The integrated circuit device according to claim 1, wherein the top surface of the insulator has concave divots where the insulator contacts the fins.

3. The integrated circuit device according to claim 1, wherein the insulator is a shallow trench isolation (STI) region between the fins.

4. The integrated circuit device according to claim 1, wherein the insulator comprises a flowable oxide.

5. The integrated circuit device according to claim 1, wherein the material layer comprises SiGe.

6. An integrated circuit device comprising:

a material layer;

trenches in the material layer dividing the material layer into fins;

transistors comprising the fins;

a first insulator partially filling the trenches and contacting the material layer, wherein a top surface of the first insulator has a first convex shape between first adjacent fins of the fins and a second convex shape between second adjacent fins of the fins, wherein the highest point of curvature of the first convex shape and the second convex shape occurs at a midpoint between the fins; and a second insulator on the first insulator, the fins, and the transistors, wherein the midpoint of the first convex shape of the top surface of the first insulator is a first thickness from a bottom of the trenches between the first adjacent fins that are spaced a first distance from each other, and the midpoint of the second convex shape of the top surface of the first insulator is a second thickness from the bottom of the trenches between the second adjacent fins that are spaced a second distance from each other, and wherein the first thickness is greater than the second thickness and the first distance is greater than the second distance, wherein third adjacent fins of the fins are spaced a third distance that is less than the first distance and the second distance, and wherein the top surface of the first insulator between the third adjacent fins has a flat, planar shape.

7. The integrated circuit device according to claim 6, wherein the top surface of the first insulator has concave divots where the first insulator contacts the fins.

8. The integrated circuit device according to claim 6, wherein the first insulator is a shallow trench isolation (STI) region between the fins.

9. The integrated circuit device according to claim 6, wherein the first insulator comprises a flowable oxide.

10. The integrated circuit device according to claim 6, wherein the material layer comprises SiGe.

11. An integrated circuit device comprising:

a material layer;

trenches in the material layer dividing the material layer into fins, wherein different distances between the fins include a first distance and a second distance, wherein the first distance is greater than the second distance; and an insulator partially filling the trenches and contacting the material layer, wherein a top surface of the insulator has a first convex shape between first adjacent fins of the fins and a second convex shape between second adjacent fins of the fins, wherein the highest point of curvature of the first convex shape and the second convex shape occurs at a midpoint between the fins, wherein the midpoint of the first convex shape of the top surface of the insulator is a first thickness from a bottom of the trenches between the first adjacent fins that are spaced a first distance from each other, and the midpoint of the second convex shape of the top surface of the insulator is a second thickness from the bottom of the trenches between the second adjacent fins that are spaced a second distance from each other, wherein the first thickness is greater than the second thickness and the first distance is greater than the second distance, wherein third adjacent fins of the fins are spaced a third distance that is less than the first distance and the second distance, and wherein the top surface of the insulator between the third adjacent fins has a flat, planar shape.

12. The integrated circuit device according to claim 11, wherein the top surface of the insulator has concave divots where the insulator contacts the fins.

13. The integrated circuit device according to claim 11, wherein the insulator is a shallow trench isolation (STI) region between the fins.

14. The integrated circuit device according to claim 11, wherein the insulator comprises a flowable oxide.

* * * * *